United States Patent
Araki et al.

(10) Patent No.: US 10,619,644 B2
(45) Date of Patent: Apr. 14, 2020

(54) COMPRESSOR VANE OR BLADE FOR ENGINE

(71) Applicants: IHI Corporation, Koto-ku (JP); HITACHI METALS, LTD., Minato-ku (JP)

(72) Inventors: Takahito Araki, Tokyo (JP); Yuta Tanaka, Tokyo (JP); Kazuhiko Kakinuma, Tokyo (JP); Masanobu Baba, Tokyo (JP); Issei Otera, Tokyo (JP); Kana Morishita, Shimane (JP); Shuho Koseki, Shimane (JP)

(73) Assignees: IHI Corporation, Koto-ku (JP); HITACHI METALS, LTD., Minato-ku (JP)

( * ) Notice: Subject to any disclaimer, the term of this patent is extended or adjusted under 35 U.S.C. 154(b) by 392 days.

(21) Appl. No.: 15/477,740

(22) Filed: Apr. 3, 2017

(65) Prior Publication Data

US 2017/0204871 A1 Jul. 20, 2017

Related U.S. Application Data

(63) Continuation of application No. PCT/JP2015/085299, filed on Dec. 17, 2015.

(30) Foreign Application Priority Data

Dec. 25, 2014 (JP) .................. 2014-262590

(51) Int. Cl.
*F01D 5/28* (2006.01)
*F04D 29/02* (2006.01)
(Continued)

(52) U.S. Cl.
CPC ........ *F04D 29/023* (2013.01); *C23C 14/0641* (2013.01); *F01D 5/288* (2013.01);
(Continued)

(58) Field of Classification Search
CPC .... F04D 29/023; F04D 29/324; F04D 29/542; C23C 14/0641; C23C 14/06; F01D 5/288;
(Continued)

(56) References Cited

U.S. PATENT DOCUMENTS 4,904,542 A   2/1990   Mroczkowski
5,851,678 A * 12/1998   Hasz .................. C04B 35/01
                                              428/469
(Continued)

FOREIGN PATENT DOCUMENTS

CN   101851738 A   10/2010
EP   0 366 289 A1   5/1990
(Continued)

OTHER PUBLICATIONS

Combined Canadian Office Action and Search Report dated Jul. 23, 2018 in Canadian Patent Application No. 2,965,607, citing documents AA, AO and AX therein, 4 pages.
(Continued)

*Primary Examiner* — Jonathan C Langman
(74) *Attorney, Agent, or Firm* — Oblon, McClelland, Maier & Neustadt, L.L.P.

(57) ABSTRACT

A coating consists essentially of one or more selected from the group of nitrides of one or more first metals of titanium, zirconium and hafnium beyond 0 at % but less than 100 at % and a balance of silicon, and nitrides of one or more second metals of vanadium, niobium and tantalum.

5 Claims, 3 Drawing Sheets

(51) Int. Cl.
    *C23C 14/06*     (2006.01)
    *F04D 29/32*     (2006.01)
    *F04D 29/54*     (2006.01)

(52) U.S. Cl.
    CPC ......... *F04D 29/324* (2013.01); *F04D 29/542* (2013.01); *C23C 14/06* (2013.01); *F05D 2260/607* (2013.01); *F05D 2300/2284* (2013.01); *F05D 2300/2285* (2013.01); *F05D 2300/611* (2013.01); *Y02T 50/671* (2013.01); *Y02T 50/673* (2013.01); *Y02T 50/675* (2013.01)

(58) Field of Classification Search
    CPC ....... F05D 2260/607; F05D 2300/2284; F05D 2300/2285; F05D 2300/611; Y02T 50/671; Y02T 50/673; Y02T 50/675
    See application file for complete search history.

(56) References Cited

U.S. PATENT DOCUMENTS

| | | | |
|---|---|---|---|
| 7,927,709 B2* | 4/2011 | Eichmann | C23C 28/321 416/241 B |
| 2005/0255329 A1 | 11/2005 | Hazel | |
| 2006/0154093 A1* | 7/2006 | Meschter | C04B 41/009 428/469 |
| 2009/0297720 A1 | 12/2009 | Ramgopal et al. | |
| 2010/0086397 A1 | 4/2010 | Varanasi et al. | |
| 2010/0226783 A1 | 9/2010 | Lipkin et al. | |
| 2010/0247321 A1* | 9/2010 | Kulkarni | C23C 28/347 416/223 R |
| 2011/0165433 A1 | 7/2011 | Pabla et al. | |
| 2011/0293909 A1 | 12/2011 | Ni et al. | |
| 2012/0148762 A1 | 6/2012 | Wei et al. | |
| 2012/0282050 A1* | 11/2012 | Setoyama | C04B 35/5831 407/118 |
| 2013/0280480 A1* | 10/2013 | Uihlein | C23C 28/042 428/116 |
| 2014/0200132 A1 | 7/2014 | Yamamoto et al. | |
| 2014/0234096 A1 | 8/2014 | Klam et al. | |
| 2018/0347390 A1* | 12/2018 | Wilson | C23C 14/0641 |

FOREIGN PATENT DOCUMENTS

| | | |
|---|---|---|
| EP | 1 595 977 A2 | 11/2005 |
| JP | 60-56061 | 4/1985 |
| JP | 2-175859 | 7/1990 |
| JP | 2009-138674 | 6/2009 |
| JP | 2010-209913 | 9/2010 |
| JP | 5140200 | 2/2013 |
| JP | 2014-185636 | 10/2014 |
| WO | WO 2014/196634 A1 | 12/2014 |

OTHER PUBLICATIONS

Diserens, M., et al., "Improving the Properties of Titanium Nitride by Incorporation of Silicon", Surface and Coatings Technology, vol. 108-109, Oct. 10, 1998, pp. 241-246.
Extended European Search Report dated May 8, 2018 in European Patent Application No. 15872872.5 citing documents AA-AD and AO therein, 8 pages.
International Search Report dated Mar. 22, 2016 in PCT/JP2015/085299, filed on Dec. 17, 2015 (with English Translation).
Written Opinion dated Mar. 22, 2016 in PCT/JP2015/085299, filed on Dec. 17, 2015.

* cited by examiner

COMPRESSOR VANE OR BLADE FOR ENGINE

CROSS-REFERENCE TO RELATED APPLICATIONS

This application is a Continuation Application of PCT International Application No. PCT/JP2015/085299 (filed Dec. 17, 2015), which is in turn based upon and claims the benefit of priority from Japanese Patent Application No. 2014-262590 (filed Dec. 25, 2014), the entire contents of which are incorporated herein by reference.

BACKGROUND

Technical Field

The disclosure herein relates to a vane or a blade of a compressor for an aircraft jet engine or a gas turbine engine, and in particular relates to a compressor vane or blade capable of keeping good aerodynamic properties as deposits on surfaces of the vane or the blade naturally exfoliate.

Description of the Related Art

In an aircraft jet engine or a gas turbine engine, its combustor creates high-speed hot gas, its turbine extracts energy from the hot gas, and part of the energy is used to drive its compressor. The compressor sucks ambient air and compresses and supplies it to the combustor. The air is, in the compressor, adiabatically compressed and therefore generates high temperatures about 400-700 degrees C. for example.

While the ambient air contains various types of dust and sand as well as volcanic ash in some cases, it is unavoidable that these substances flow into the compressor. Part of these substances may, along with the compressed air, pass through the compressor and be exhausted out but another part thereof may adhere to the vanes and the blades of the compressor. The ambient air further contains moisture, sulfates, sulfites, chlorides, carbonates and such in the form of gas or minute droplets, which may adhere to the vanes and the blades of the compressor as well. These foreign substances are, by being exposed to high temperatures, physically and chemically changeable into deposits that adhere to the surfaces of the vanes and the blades.

Because an excessive amount of deposits impairs the aerodynamic properties of the compressor vanes and blades, it is necessary to remove them, and, if necessary, re-finish surfaces of the vanes and the blades, in order to restore these original states. Required work includes processes of disassembling the engine, taking out each compressor vane or blade, restoring these original states individually, and re-assembling them into the engine. These laborious processes cause a marked rise in cost about overhauling the engine.

There are some proposals about some arts for coatings to address the problem raised by the deposits. The following literatures disclose related arts. Coatings disclosed therein are intended to prevent adhesion of foreign substances.

United States Patent Application Publication 2010/0247321

United States Patent Application Publication 2010/0086397

SUMMARY

Coatings according to the aforementioned related arts may work in the early stage where the foreign substances start to adhere to the surfaces of the vanes and blades to prevent adhesion thereof. Once the adhesion starts and sticking deposits start to form, however, the coated surfaces are covered by the deposits and subsequently arriving foreign substances can become deposited on the precedent deposits. It could not be expected in this stage that the effect of the coatings amounts to much and therefore the deposits would grow as much as those in the prior arts do. More specifically, what these related arts do is nothing more than retardation of the early stage of deposition and therefore these arts cannot essentially solve the problem of the deposits. The contents disclosed in the specification are arts created in order to solve these problems originated from environments containing abundant foreign substances.

A compressor vane or blade for an engine used in an environment containing abundant foreign substances is comprised of a base body of the compressor vane or blade; and a coating covering the base body, the coating consisting essentially of one or more selected from the group of nitrides of one or more first metals of titanium, zirconium and hafnium beyond 0 at % but less than 100 at % and a balance of silicon, and nitrides of one or more second metals of vanadium, niobium and tantalum.

DETAILED DESCRIPTION OF THE EXEMPLARY EMBODIMENTS

Exemplary embodiments will be described hereinafter with reference to the appended drawings.

As described already, the foreign substances sucked into the engine contain sulfates. Sulfates are more oxidative than oxygen and therefore gradually corrode even highly corrosion-resistant materials such as CrAlN when combined with a high temperature environment. While such corrosion results in formation of metal oxides, numerous metal oxides generated in such an environment have compact structures and are rigid, and in some cases function as anchors for holding the deposits. Therefore they do not prevent, but rather sometimes promote, adhesion of subsequent deposits thereon.

The present inventors discovered that specific metals can form coarse and brittle oxides even in the environment at issue. Examples thereof could be titanium, or zirconium and hafnium as its equivalents in chemical properties, and vanadium, or niobium and tantalum as its equivalents in chemical properties.

The present inventors further discovered that these oxides come into being at an interface between the deposits and the coating and have a property of promoting exfoliation of them (sometimes referred to as "exfoliative property" hereinafter). The deposits would thereby get exfoliated before growing up into a thick layer and be blown off by flow of the compressed air. The coating could repeatedly recover its fresh surface and therefore the property of promoting exfoliation of the deposits could be maintained for a long term. This property is available to compressor vanes and blades of an aircraft jet engine or a gas turbine engine for suppressing deposition of deposits for a long term.

Creation of the contents disclosed herein has been achieved on the basis of these discoveries.

Figure 1:
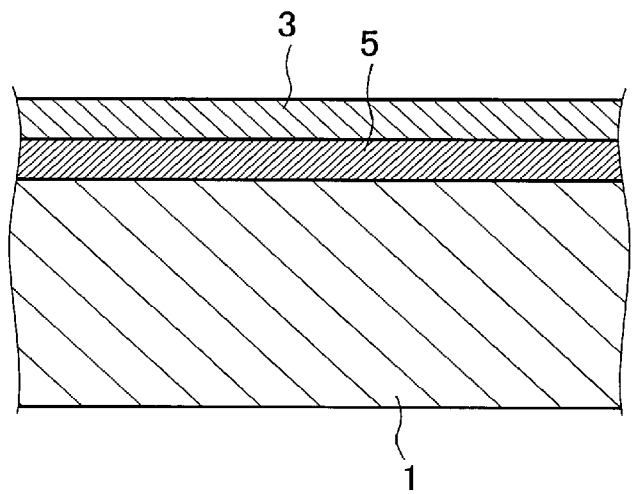
FIG. 1 is a schematic cross sectional view of a base body and a coating in accordance with an embodiment.

Referring to FIG. 1, an engine compressor vane or blade according to an embodiment is comprised of a base body 1 of the compressor vane or blade and a coating 3 covering the base body 1. The base body 1 is one of vanes and blades of a compressor for an aircraft jet engine or a gas turbine engine and is applicable to either a rotor blade or a stator vane. The coating 3 is of a titanium-silicon nitride ($Ti_xSi_{1-x}N$) for example. The coating thickness may be arbitrarily determined but may be 3 micrometers or more for example as a greater thickness is advantageous in order to ensure a longer lifetime. Further, it may be 10 micrometers or less for example as a smaller thickness is advantageous in order to reduce a risk for causing defects.

Titanium and silicon contained in the coating 3, when coexisting with sulfates, form complex oxides at considerably elevated temperatures. Complex oxides containing titanium, as having an action of promoting exfoliation of deposits from the coating 3 as described already, suppresses deposition of the deposits for a long term. Throughout the present description and the appended claims, a coating having such a property is referred to as "exfoliative coating".

The ratio of titanium to silicon in the nitride may be arbitrarily selected. However, when titanium is 0 at % (x=0), the aforementioned effect could not be enjoyed. Therefore titanium should be beyond 0 at % and preferably be 60 at % or more. On the other hand, as compared with the case where titanium is 100 at % (x=1), some properties such as corrosion-resistance could be improved when silicon is contained therein. Therefore titanium is less than 100 at % and is more preferably 80 at % or less. Silicon is preferably 15 at % or more and is also preferably 40 at % or less.

Titanium could be substituted for zirconium or hafnium, both of which have equivalent chemical properties as described above. More specifically, the coating 3 may include a zirconium-silicon nitride ($Zr_xSi_{1-x}N$) or a hafnium-silicon nitride ($Hf_xSi_{1-x}N$).

Vanadium, or chemical equivalents such as niobium or tantalum, is available as the exfoliative coating as described earlier. More specifically, the coating 3 may be of any nitrides of one or more metals selected from the group of vanadium, niobium and tantalum.

A smoother surface of the coating 3 is advantageous in light of prevention of adhesion of the deposits. Thus the surface roughness of the coating 3 is preferably 0.1 Ra or less (Ra is an arithmetic average roughness based on Japanese Industrial Standards: JIS-B-0601-2001).

Mere exposure of the aforementioned coating 3 is enough for exhibiting the inherent property and therefore, below the coating 3, any intermediate coating 5 distinguishable therefrom may be interposed. The intermediate coating 5 is formed of, or includes, any components distinct from the coating 3, or alternatively may be formed of the same components but have a distinct composition. The intermediate coating 5 may further include two or more layers that are distinguishable from each other.

The components for the intermediate coating 5 may be arbitrarily selected in light of various properties. A titanium-aluminum nitride ($Ti_yAl_{1-y}N$) or a chromium-aluminum nitride ($Cr_zAl_{1-z}N$) is applicable to the coating 5 in light of improvement of corrosion-resistance and erosion-resistance for example. Alternatively, any substances that are advantageous for improving adhesion between the coating 3 and the base body 1 or relaxing stress around the interface can be selected and applied to the coating 5.

Figure 2:
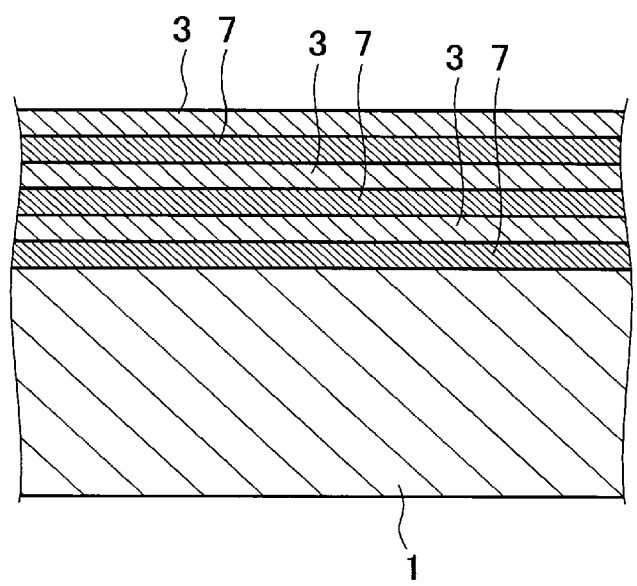
FIG. 2 is a schematic cross sectional view of a base body and a coating in accordance with another embodiment.

Still alternatively, the coating 3 and another coating 7 may be alternately layered to form a multi-layered coating of three or more sets of the alternate layers as shown in FIG. 2. To form a multi-layered structure is advantageous for relaxing residual stress or such.

In the multi-layered coating, for example, a coating of a titanium-silicon nitride and a coating of a titanium-aluminum nitride may be alternately layered. Alternatively, a coating of a titanium-silicon nitride and a coating of a vanadium nitride may be alternately layered. Still alternatively, both of them may be titanium-silicon nitrides but ratios of titanium to silicon therein may be differentiated. The other coating 7 by itself may include two or more layers mutually distinguishable. Further, in the multi-layered coating, the uppermost layer is preferably the coating 3. In the multi-layered coating, each layer may be about from 10 to 20 nm in thickness.

While the coating 3 fully covers the airfoil faces of the engine compressor vane or blade at least, it may further cover its platform section (in a case of a rotor blade), or its inner band section and its outer band section (in a case of a stator vane). Further the coating 3 may be limited to these sections. Other sections in the engine compressor vane or blade are either a section used for fixation to the engine or a section to rub against another member. These sections will, if coated by any hard coating such as nitrides, will soon wear the opposite member off. To limit the coating on the airfoil faces and the platform section or the inner band section and the outer band section is advantageous for elongating the lifetime of the opposite member.

Mechanisms by which the coating 3 prevents deposition of the deposits will be described with reference to FIGS. 3A through 3C.

Figure 3A:
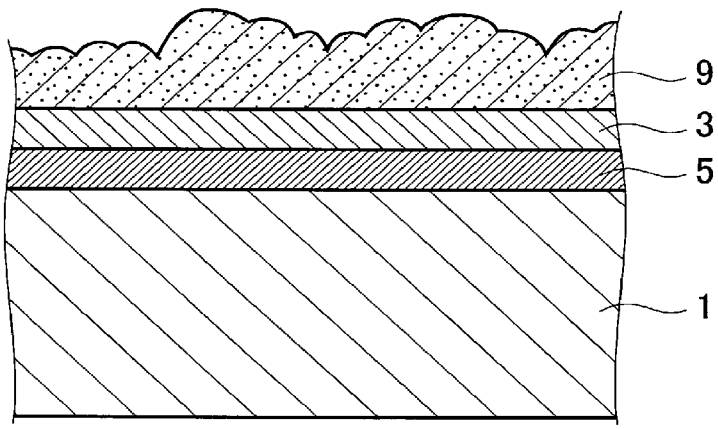
FIG. 3A is a schematic cross sectional view showing a state where foreign substances adhere to the coating to form deposits.
Figure 3B:
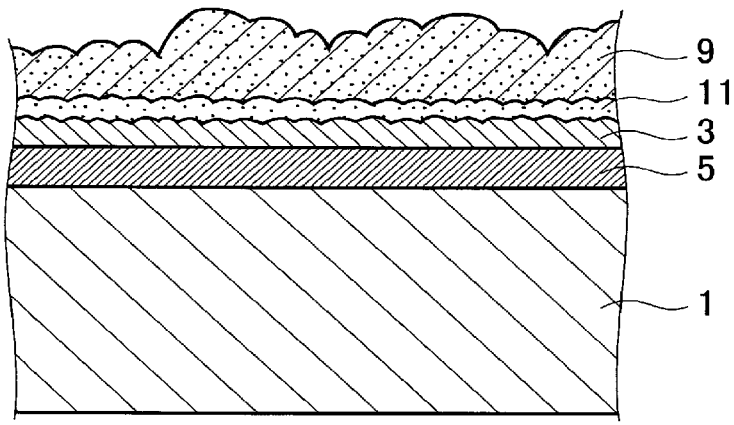
FIG. 3B is a schematic cross sectional view showing a state where the coating reacts with sulfates contained in the foreign substances to create an exfoliative layer.
Figure 3C:
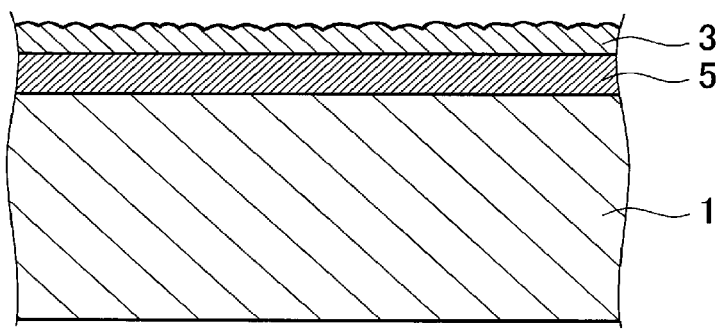
FIG. 3C is a schematic cross sectional view showing a state where the exfoliative layer along with the deposits comes off from the coating.

Deposits 9 contain dust, sand, volcanic ash, moisture, sulfates, sulfites, chlorides, carbonates and such, and can adhere onto the coating 3 as shown in FIG. 3A. The combination of oxidative power by the sulfates or such and elevated temperatures about 400-700 degrees C. for example created by adiabatic compression of the air causes formation of oxides 11 of the coating 3 at the interface between the coating 3 and the deposits 9 as shown in FIG. 3B.

As these oxides 11 contain brittle substances such as titanium oxide or such, the deposits 9 along with the oxides 11 exfoliate therefrom. Observation of its cross section by TEM or such shows that only a layer of the oxides 11 several hundred nm in thickness at the most exists there. More specifically, it is considered that the oxides 11 would exfoliate before it grows up to several hundred nm in thickness.

After the exfoliation, a fresh surface of the coating 3 is exposed as shown in FIG. 3C, and can create again the action of promoting exfoliation of deposits that are going to adhere onto the surface. Loss of the coating 3 in each occasion of exfoliation would be no more than several hundred nm in thickness as the layer of the oxides 11 could exfoliate before growing thick as described above. In contrast, as the thickness of the coating 3 is about 3-10 micrometers as also described above, the coating 3 survives even after repeating exfoliation several ten times and therefore keeps its effects for a long term.

The coating 3 (or the coatings 5, 7 as well) on the base body 1 can be formed by using a known arc ion plating method for example. Alternatively, a sputtering method or any of other coating methods is also applicable. The production method will be described below, in which the arc ion plating method is applied.

First the base body 1 and a raw material for evaporation are introduced into an arc ion plating apparatus. In a case where the coating 3 is to be formed of a titanium-silicon nitride, the raw material is an ingot of a titanium-silicon alloy. Its composition should be selected in accordance with a target composition as desired in the coating.

In a case where the base body 1 is a rotor blade, its dovetail section is fit into the holder to combine the base body with the holder. This is not only to establish electrical connection but also uses the holder to shelter the dovetail section from discharge, thereby being helpful to limit formation of the coating to a restricted portion. More specifically, this is helpful to limit formation of the coating to the airfoil faces and the platform section of the rotor blade. In a case where the base body 1 is a stator vane, structures outside the outer band section or inside the inner band section are used. This is helpful to limit formation of the coating to the airfoil faces and the outer band section or the inner band section of the stator vane.

The chamber is gas-tightly closed and evacuated down to a proper vacuum by means of a vacuum pump. This is helpful to eliminate impurities. The evacuation is continued to the extent that a degree of vacuum reaches about 0.01 Pa or such.

With continued evacuation, valves of the gas supplier device are opened and thereby argon and nitrogen are introduced therein so as to regulate the pressure in the chamber. The pressure is 2-10 Pa for example.

By a discharge power source, a voltage is applied between the evaporation source and the chamber to generate discharge therebetween, and, simultaneously by a bias power source, a bias voltage is applied to the base body 1. The titanium-silicon alloy as the evaporation source works as a cathode to generate the discharge. And as well, titanium and silicon change into vapor and are partly ionized and accelerated by the bias voltage toward the base body 1. They react with nitrogen in the gas phase to form the coating 3.

As described already, sections sheltered in the holder are free from formation of the coating but gas phase particles are induced by the bias electric field to come around to all the exposed surfaces of the base body 1. Thereby the coating 3 fully covers all the surfaces other than the sheltered surfaces.

For the purpose of verifying the effects, burner rig tests are executed to compare adhesion amounts of deposits.

Figure 4:
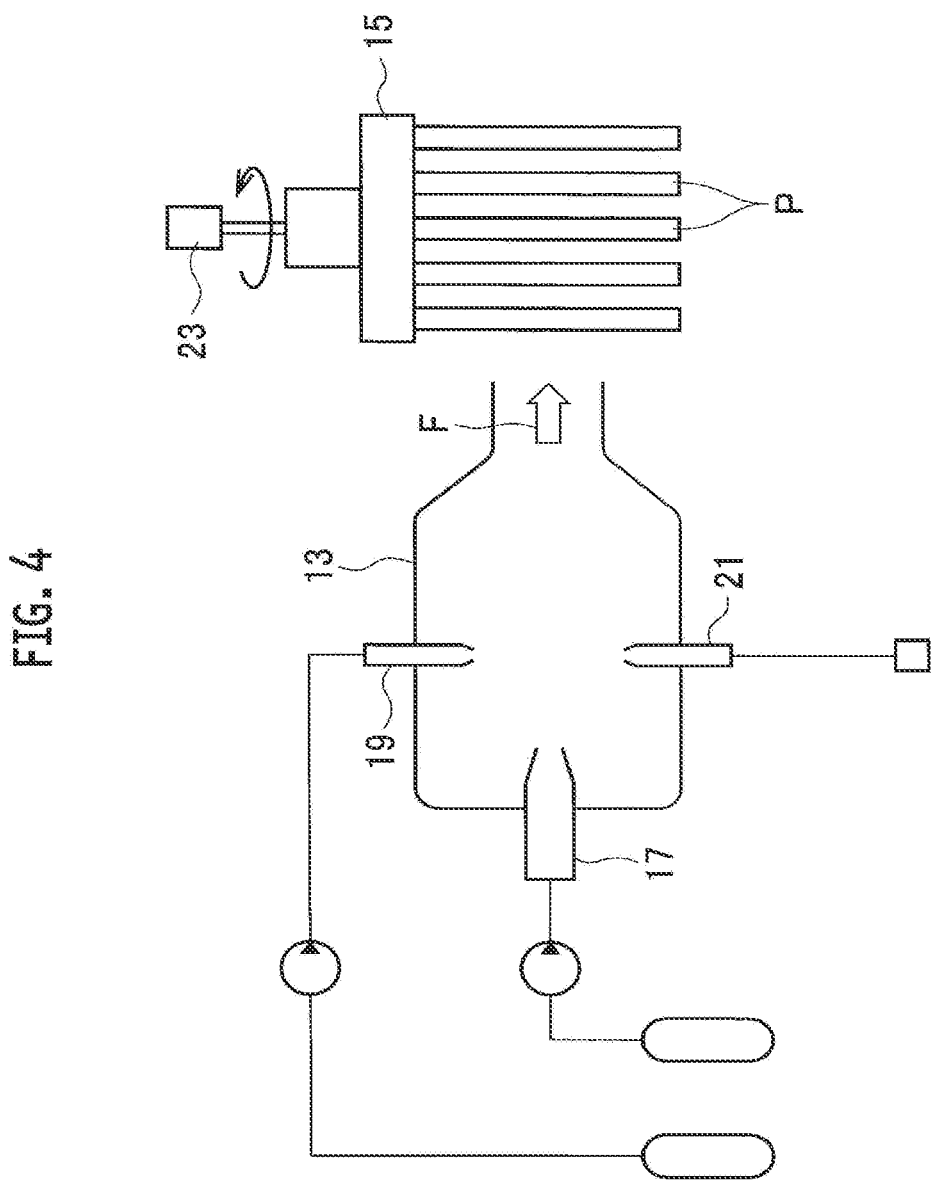
FIG. 4 is a schematic drawing of a burner rig test apparatus.

Referring to FIG. 4, a burner rig test apparatus is generally constituted of a burner 13 for generating hot gas and a holder 15 for supporting test pieces. To the burner 13, a fuel nozzle 17 comprised of a supply system for supplying kerosene for example and a salt water nozzle 19 comprised of a salt water supply system are connected. As gas flow expelled from these nozzles is ignited by a plug 21, hot gas flow F is generated. The holder 15 is so constituted as to support a plurality of test pieces P of a round bar shape. By rotating the holder 15 around an axis perpendicular to the gas flow F by means of a motor 23, the plurality of test pieces P is unitarily exposed to the hot gas flow F.

Test pieces of a round bar shape formed of INCONEL718 (INCONEL is a name commonly used by persons skilled in this art field) on which titanium-silicon nitride (TiSiN) coatings are formed, test pieces on which vanadium nitride (VN) coatings are formed, and test pieces without coatings are respectively produced.

Table 1 summarizes relations between the compositions of the evaporation raw materials (target compositions) and the compositions in the formed coatings, in regard to the titanium-silicon nitride. In this table, the compositions of the coatings are results from elemental analyses by EPMA, each in which three spots in each SEM image are subject to point analysis and results are averaged.

TABLE 1

| Compositions of Coatings (at %) | | |
| --- | --- | --- |
| Evaporated Material (Target Composition) | Composition of Coating (at %) | |
| Ti:Si | Ti | Si |
| 85:15 | 87.8 | 12.2 |
| 75:25 | 78.5 | 21.5 |
| 60:40 | 61.9 | 38.1 |

As being apparent from Table 1, slight shifts from the compositions of the evaporation raw materials could be respectively acknowledged. It is, nevertheless, apparent that the compositions of the coatings can be regulated in accordance with the compositions of the evaporation raw materials. In the following description and the appended claims, the compositions of the coatings are not based on results of elemental analyses but on the compositions of the evaporation raw materials (target compositions). The coatings will often be expressed in the form such as $Ti_{0.75}Si_{0.25}N$ so that the coatings are expressed in combination with these compositions.

The aforementioned test pieces are respectively served for the burner rig test. As salt water, calcium sulfate solution is supplied to the burner. Each test piece is attached to the holder and is, with rotating the holder, exposed to hot gas flow for two hours, thereafter detached therefrom and subject to visual observation and weight change measurement. Thereafter each test piece is again attached to the holder and is, with rotating the holder, exposed to hot gas flow for forty hours, thereafter detached therefrom and subject to visual observation and weight change measurement. Table 2 summarizes the measurement results of weight changes.

TABLE 2

| Weight Changes after Burner Rig Tests | | |
| --- | --- | --- |
| Coating | First Exposure (2 hours) | Second Exposure (40 hours) |
| $Ti_{0.75}Si_{0.25}N$ | 0.10 | 0.10 |
| VN | 0.08 | 0.08 |
| no coating | 0.38 | 0.31 |

The test pieces without the coatings exhibit ash gray deposits adhering on whole portions exposed to the hot gas flow. While the test pieces with the coatings also exhibit ash gray deposits, these deposits are partly exfoliated and portions from which the deposits come off exhibit metallic luster. The results of the weight change measurements present that the test pieces without the coatings make considerable weight gains, which are considered to be corresponding to the weights of the deposits, but the test pieces with the coatings only make slight weight gains. As being apparent from these test results, the test pieces with the coatings have a prominent effect of promoting exfoliation of the deposits as compared with those without the coatings.

Influence of the compositions in the titanium-silicon nitride coatings is studied. Test pieces with a $Ti_{0.85}Si_{0.15}N$ coating, a $Ti_{0.75}Si_{0.25}N$ coating and a $Ti_{0.60}Si_{0.40}N$ coating, respectively, are produced by changing the compositions in the evaporating raw materials in a process similar to the aforementioned process, and are served for the burner rig test. Table 3 summarizes the measurement results of weight changes. Meanwhile, it is noted that the present test cannot be compared with the aforementioned test because the present test had been executed in an opportunity distinct from the aforementioned test, and therefore comparison is only possible within the present test.

TABLE 3

Influence of Composition on Weight Change

| Coating | First Exposure (2 hours) | Second Exposure (40 hours) |
| --- | --- | --- |
| $Ti_{0.85}Si_{0.15}N$ | 0.17 | 0.19 |
| $Ti_{0.75}Si_{0.25}N$ | 0.23 | 0.35 |
| $Ti_{0.60}Si_{0.40}N$ | 0.23 | 0.41 |

As being apparent from these measurement results of weight changes, in the range of 60 at % or more and 85 at % or less of titanium relative to the total of titanium-silicon, the effect of promoting exfoliation of the deposits can be acknowledged as with the case of 75 at %. In this range, however, greater ratios of titanium seem to be more effective.

Comparison between single layer coatings and multi-layered coatings is executed. Table 4 summarizes the measurement results of weight changes. It is noted again that the present test cannot be compared with the aforementioned tests because the present test had been executed in an opportunity distinct from the aforementioned tests. In the multi-layered coatings, titanium-silicon nitride layers are alternated with the other layers into three sets. Each layer is about 20 nm in thickness.

TABLE 4

Comparison between Single Layered Coating and Multi-Layered Coating

| Coating | First Exposure (2 hours) | Second Exposure (40 hours) |
| --- | --- | --- |
| $Ti_{0.85}Si_{0.15}N$ Single Layer | 0.17 | 0.19 |
| $Ti_{0.75}Si_{0.25}N$ Single Layer | 0.23 | 0.35 |
| $Ti_{0.60}Si_{0.40}N$ Single Layer | 0.23 | 0.41 |
| $Ti_{0.75}Si_{0.25}N$/VN Multi-Layer | 0.12 | 0.14 |
| $Ti_{0.75}Si_{0.25}N$/TiN Multi-Layer | 0.24 | 0.41 |
| $Ti_{0.75}Si_{0.25}N$/CrN Multi-Layer | 0.23 | 0.43 |

From the measurement results of weight changes, it is apparent that the multi-layered coatings exhibit similar effects. Particularly the multi-layered coating of the combination of titanium-silicon nitride and vanadium nitride is excellent in the effects.

Although certain embodiments have been described above, modifications and variations of the embodiments described above will occur to those skilled in the art, in light of the above teachings.

INDUSTRIAL APPLICABILITY

An engine compressor vane or blade is provided, on which deposits hardly deposit even in an environment containing abundant foreign substances.

What is claimed is:

1. A compressor vane or blade for an engine used in an environment containing abundant foreign substances, the compressor vane or blade comprising:
   a base body of the compressor vane or blade; and
   a coating covering the base body and exposed to the environment, the coating consisting essentially of a nitride of titanium beyond 60 at % but less than 85 at % and a balance of silicon.

2. The compressor vane or blade of claim 1, wherein the coating is limited at and fully covers an airfoil face, a platform section or an inner band section, and an outer band section.

3. The compressor vane or blade of claim 1, further comprising:
   an intermediate coating interposed between the coating and the base body.

4. The compressor vane or blade of claim 3, wherein the coating and the intermediate coating are alternately layered to form a multi-layered coating of three sets or more of alternating layers.

5. The compressor vane or blade of claim 3, wherein the intermediate coating consists essentially of one or more selected from the group of titanium-aluminum nitride and chromium-aluminum nitride.

* * * * *